United States Patent Office
3,322,656
Patented May 30, 1967

3,322,656
METAL SURFACE OF IMPROVED BONDING QUALITY

Donald W. Dahringer, Glen Ridge, Sanford Spector, Bayonne, and James L. Sweet, New Monmouth, N.J., assignors, by mesne assignments, to Pittsburgh Plate Glass Company, Pittsburgh, Pa., a corporation of Pennsylvania
No Drawing. Filed Mar. 6, 1962, Ser. No. 177,732
4 Claims. (Cl. 204—38)

This invention relates to metal surfaces of improved bonding quality. In particular it relates to metal surfaces which are especially treated so as to improve the quality of their subsequent bonds to insulating material.

Laminates of metals such as copper with insulating materials have been previously described in the art and have application in the fields of electrical printed circuits, electrical switching devices and decorative devices. Such laminates are often prepared under high pressure and often at an elevated temperature. Thus, a typical commercial process in use today for preparing such copper-insulating material laminates comprises stacking together one or more layers of a carrier material impregnated with a heat-reactive thermosetting resin, and a sheet of copper foil coated on the carrier side with adhesive. The stack is then subjected to pressure in a suitable press at a sufficiently high temperature to effect a cure in both the resin and the adhesive so as yield a hard, dense laminate with a firmly adhered copper foil surface.

The carrier for the base laminate is generally a porous or fibrous insulating material such as cellulosic paper, cotton cloth, nylon cloth or glass cloth. The heat-reactive thermosetting resins which can be used to impregnate the carrier include curable phenolic resins of both the water-soluble and alcohol-soluble type, low molecular weight melamine condensation products, low molecular weight ureaformaldehyde condensation products, curable polyester resins and curable epoxy resins. Impregnation is generally accomplished by dissolving the resin in a suitable solvent and then applying the solution by dipping or coating. The impregnated carrier is generally dried to remove solvents and sometimes partially cured to control flow properties.

The copper foil generally used in laminates for printed circuits is made by continuous electro-deposition and is characterized as having one shiny side and one matte microcrystalline surface. The adhesive is generally applied to the copper in a solution so as to give a dry thickness of between 0.0003 and 0.005 inch. The adhesive solution is normally forced dried so as to remove the solvent in such a manner as to prevent blistering and provide a homogeneous continuous film. Before assembling the laminate, the adhesive film is sometimes subjected to heat to effect a partial cure and thus prevent excessive inter-penetration between the cured resin and the adhesive.

Although such laminates have been found to be useful, their utility in connection with electrical printed circuits has been limited by a substantial incidence of bonding quality below that required for printed circuits. Printed circuits require a bonding quality which is sufficiently high so as to avoid the problems caused by the environmental heat generated by electronic compounds associated with such printed circuits. Although several treatments for a metal surface, such as copper, have been proposed in the past to improve bonding quality, any improvement in bonding strength that may have resulted has been generally accompanied by certain undesirable characteristics, including: surface discoloration of copper during storage, poor aging characteristics of the bonded laminate, low surface electrical resistance of the adhesive layer after etching, deterioration in bond strength after exposure to heating, product variability and laminate discoloration after etching.

One object of this invention is to provide a surface treatment for metal which will improve the over-all bond of metal-clad laminates without any of the above-stated deficiences.

Further objects and advantages of this invention will be apparent from the specification and claims which follow.

The process of this invention comprises generally the formation of a thin adherent micro-rough layer on the surface of the metal having a much greater surface area than the original surface. Such layer is formed by treating the metal surface as a cathode in an alkaline copper electrolytic bath. The electrolytic treatment provides laminates which are markedly improved in bonding quality, as for example, solder resistance and initial peel strength, as compared with untreated metal surfaces. Further, if the electrolytically formed layer is subsequently treated with a solution containing a solute characterized as being capable of forming with copper a compound which has low solubility in the solution, there results an even greater improvement in bonding quality, particularly in peel strength in the laminate after long heat exposure, than the electrolytic process used alone.

The metal surfaces whose bonding quality may be improved by this invention may be in any form, such as separate sheets or sheets pre-laminated to another surface. The thickness of the sheet may vary and includes thin foils. Although this invention is applicable to any metal, it is particularly useful with the common metals which are readily platable with a metal. Such common metals include copper, copper alloys with zinc, nickel, tin and/or lead, mild steel, silver, zinc, cadmium and tin.

Where a sheet of metal is used, as for example, foil, either one or both sides may be treated. In printed circuits, however, where electrolytic copper is used, it is generally desired to treat only the matte side and thus leave the other side, which is normally brilliant, untouched. Rolled copper, also used in printed circuits, can be treated on either surface.

The electrolytic process is generally most effective with a cathodic current density of from approximately 10 to 150 amperes per square foot. The electrolytic bath may also contain a complexing agent, as for example, Rochelle salt, salicylic acid, glycerol, citric acid or glycollic acid.

As regards solution treatment of the electrolytically-formed layer, two groups of solutes have been found to be particularly effective in achieving the greater improvement in bonding quality. One group consists of compounds capable of forming a sulfide, telluride or selenide with copper. The second group consists of weakly acidic solutions of compounds capable of forming a chromate, molybdate, tungstate or vanadate with copper. With either of these two groups of compounds the exposure time of the electrolytically treated surface to the solution is generally brief and usually less than a minute. The surface is then rinsed thoroughly and may be dried with an air blast or heat.

With the second group of solutions (those providing the chromate, molybdate, tungstate or vanadate) the solution strength is generally most effective if it is from about 2 to about 25% by weight, being particularly effective in a range of from approximately 5 to 10%. The solution should be weakly acidic and in the general range of pH of between 2.5 and 7.0 (electrometric). A particularly effective acidity is in the range of pH of approximately 4.0 to 4.5 (electrometric). The preferred temperature range is from approximately 35° F. to 100° F., with approximately 40° F. to 70° F. being most useful.

With respect to specific solutes we have found that a chromate-forming solute such as potassium or sodium dichromate in the weakly acidic solution is most advantageous because of the greater stability of the solution, the greater resistance to oxidation and corrosion that is afforded and the lack of color change of either the electrolytically treated surface or the opposite surface of the sheet of metal when exposed to the dichromate solution.

The treated metal surface can be used as such or can be pre-coated with an adhesive composition. We have found that with copper foil, particularly effective adhesive compositions include (1) a mixture of a polyvinyl acetal and a fusible, thermo-setting phenol-aldehyde resin, (2) a mixture of a polyepoxide resin, a polyvinyl acetal and a fusible, thermo-setting phenol-aldehyde resin, (3) a mixture of a polyepoxide resin, a butadiene-acrylonitrile copolymer, and a fusible thermo-setting phenol-aldehyde resin, and (4) a mixture of a butadiene-acrylonitrile copolymer and a fusible thermosetting phenol-aldehyde resin. Among these adhesive compositions those which comprise polyepoxide resin, phenol-aldehyde resin and either butadiene-acrylonitrile copolymer or polyvinyl acetal resin (as exemplified by Examples 11 and 13 hereinafter) generally exhibit higher chemical resistance than the other particular compositions described, although all are useful to meet the objects and purposes of this invention. Further examples of these three-component type adhesive compositions may be found in U.S. Patent No. 2,920,990.

The process of this invention when used with adhesive compositions comprising butadiene-acrylonitrile copolymers in admixture with either fusible, thermosetting phenol-aldehyde resin alone or fusible thermosetting phenol-aldehyde resin in conjunction with a polyepoxide resin (as exemplified by Examples 12 and 13 hereinafter) is particularly effective in the preparation of copper laminates to be used in making "stamped" circuits. "Stamped" circuits are those wherein during the pressing cycle a heated die cuts the copper and only the copper area intended as the circuit is held under pressure. The unwanted copper is then stripped away manually.

Examples of suitable electrolytic baths for use in this invention are given below:

EXAMPLE 1

| | G./l. |
|---|---|
| $CuSO_4 \cdot 5H_2O$ | 100 |
| Rochelle salts | 125 |
| NaOH | 35 |

The temperature of the bath may vary from about 50° to about 180° F., preferably between about 60° and about 110° F. The metal surface, e.g., copper foil, is used as the cathode or negative electrode. The anode or positive electrode may be of insoluble material such as stainless steel, platinum, gold, etc., or a soluble anode of copper may be used. Either alternating current or direct current may be used, although direct current is preferred. The cathodic current density should be between about 10 and about 150 amps/sq. ft., preferably between about 30 and about 100 amps/sq. ft. Anode current density is not critical but should be as low as possible. Treatment time may vary between about 2 and about 120 seconds, preferably between about 5 and about 40 seconds. The constituents in the bath may vary widely, but are generally within the following ranges:

| | G./l. |
|---|---|
| $CuSO_4 \cdot 5H_2O$ | 25 to 150 |
| Rochelle salts | 75 to 300 |
| NaOH | 20 to 75 |

pH (electrometric), 7.2 to 13.4.

Alkaline solutions containing copper and employing other complexing agents are also useful. Alkali-metal salts of organic acids such as citric, lactic, glycollic, and salicylic non-acid organic compounds such as glycerol and alkali-metal salts of certain inorganic acids such as pyrophosphoric and tetraboric may also be used.

EXAMPLE 2

| | G./l. |
|---|---|
| $CuSo_4 \cdot 5H_2O$ | 24 |
| Salicylic acid | 56 |
| NaOH | 42 |

EXAMPLE 3

| | |
|---|---|
| $CuSO_4 \cdot 5H_2O$ | 15 |
| Borax | 150 |

EXAMPLE 4

| | |
|---|---|
| $CuSO_4 \cdot 5H_2O$ | 100 |
| Lactic acid, 85% | 150 |
| NaOH | 112 |

EXAMPLE 5

| | |
|---|---|
| $CuSO_4 \cdot 5H_2O$ | 100 |
| Glycerol | 125 |
| NaOH | 50 |

EXAMPLE 6

| | |
|---|---|
| $CuSO_4 \cdot 5H_2O$ | 100 |
| Citric acid | 355 |
| NaOH | 246 |

EXAMPLE 7

| | G./l. |
|---|---|
| $CuSO_4 \cdot 5H_2O$ | 100 |
| Glycollic acid | 122 |
| NaOH | 112 |

EXAMPLE 8

| | |
|---|---|
| $CuSO_4 \cdot 5H_2O$ | 100 |
| $Na_4P_2O_7 \cdot 10H_2O$ | 275 |

EXAMPLE 9

| | |
|---|---|
| $CuSO_4 \cdot 5H_2O$ | 15 |
| NaOH | 400 |

The addition of sodium carbonate or small amounts of other inorganic or organic buffering agents will have a stabilizing effect on the baths.

After electrolytic treatment, the surface must be thoroughly rinsed. Where the solution treatment is to follow it is preferably done immediately after the electrolytic step. Several specific examples of such solution treatment follow:

Formula 1—approximately 30 second immersion in about 5% thiourea (made alkaline with NaOH) at 70° C.
Formula 2—approximately 10 second immersion in about 5% sodium sulfide at room temperature.
Formula 3—approximately 10 second immersion in about 4% polysulfide oxidizing liquid at room temperature (e.g. McGean's oxidizing liquid).
Formula 4—approximately 30 second immersion in 7% sodium or potassium dichromate solution at 65° F.

The solution treated foil should also be rinsed very thoroughly in cold water and may then be rinsed in hot water and dried with an air blast or heat.

Thermosetting adhesive compositions for use in this invention are discussed and exemplified below.

The foil may be used just as treated and bonded directly to the base material or to an interposed adhesive film. In some cases, after treatment as described above, the foil is coated with adhesive on a conventional coating machine. The adhesive formulations given in the following examples are preferred but do not limit the invention inasmuch as the bonding properties of other adhesive classes and of minor variations in the described adhesive will also be improved by the copper surface treatment.

The general procedure in evaluating the effect of the surface treatment was to coat the treated surface and evaporate solvent from the adhesive film at a temperature of about 225° F. for about 10 minutes and then fully dry the film at 285° F. for about 15 minutes. The dry adhesive film had a thickness of about 1½ mils but may be varied from 0.3 to 5 dry mils.

The adhesive coated copper foil (treated and untreated) composition was then laminated to a typical commercial phenolic impregnated cellulose paper, the cured properties of which meet the NEMA spec. (LP–1) for grade XXXP copper clad laminates. The testing procedure used for bond strengths was as specified in NEMA spec. LP–1–7.06 while the heat resistance by Hot Solder Test LP–1–7.08 was modified by using a higher temperature (500° F.) and testing time to blister. The test results follow the adhesive formulation designated as Example 11.

EXAMPLE 10.—PHENOL-ALDHEYDE RESIN—POLYVINYL ACETAL

The phenol-aldehyde resin should be fusible and thermosetting. The phenol used may be phenol or phenol completely or partially replaced by resorcinol, cresol, and xylenol, etc. The aldehyde may be formaldehyde, acetaldehyde or homologs. A typical phenolic resin is the alkaline catalyzed condensation product of phenol with an excess of formaldehyde.

Among preferred polyvinyl acetals are polyvinyl formal and polyvinyl butyral. The term "polyvinyl acetal" is used in this discussion in its generic sense to include the group rather than polyvinyl acetal itself, except in the specific examples. Whenever mention is made of acetals as suitable, all the homologs are implied.

The phenol aldehyde resin may vary widely, e.g., about 40 parts to about 150 parts by weight (based on solids) on 100 parts by weight of acetal resin. Mixed aldehyde resins and mixed polyvinyl acetals (when compatible) or combinations or mixtures of both may be used. Certain other ingredients can be added to modify the ultimate properties of the bonded laminate. These might include antioxidants, plasticizers, added cross linking agents, and other compounding ingredients which would be used by a skilled formulator, up to about 50% of the total solids while maintaining the previous stated ratios of polyvinyl acetal to phenol aldehyde resins.

The following is intended to illustrate the above example only and does not limit this invention in any way.

| | Parts by Weight |
|---|---|
| Polyvinyl butyral (Bakelite resin XYSG) | 100 |
| Phenol-aldehyde resin (Bakelite resin BLS 2700—56% solids) | 107 |

These materials may be dissolved in and applied from solvent solution comprising alcohols, for example, mixtures of ethyl alcohol, isopropyl alcohol, together with other solvents such as toluene, methyl ethyl ketone, and high alcohols. The solvent is evaporated after application, e.g., in a drying oven. A typical solvent combination is:

| | Parts by Weight |
|---|---|
| 95% ethyl alcohol | 100 |
| Toluol | 50 |

EXAMPLE 11.—PHENOL-ALDEHYDE—POLVINYL ACETAL—POLYEPOXIDE

A typical example of such an adhesive composition is as follows:

| | Parts by Weight |
|---|---|
| Polyvinyl acetal (XYSG Bakelite resin) | 100 |
| Phenol-aldehyde (Bakelite resin BLS—2700—56% solids) | 100 |
| Polyepoxide resin (Epon 828) | 24 |

The above constituents may be varied to obtain various maximum specific properties for the adhesive and can be dissolved in a solvent blend of ethyl alcohol 100 parts, and toluene 50 parts (by wt.). We have found, for example, that the following ranges of proportions are particularly useful:

| | Parts by weight (based on solids) per 100 parts of acetal |
|---|---|
| Phenol-aldehyde | 40 to 120 |
| Polyepoxide resin | 5 to 40 |

These adhesive compositions provide superior laminates between treated metal foil and insulating materials, such as phenolic resin, polyester resin or epoxy resin saturated baseboards. They have excellent resistance to attack by alkali, solvents and other chemicals and equal or exceed NEMA standards for electrical properties, heat resistance, peel strengths, heat aging and resistance to molten solder.

*Test results*

EXAMPLE A

Copper foil preparation:

| | |
|---|---|
| Copper | Untreated electrosheet. |
| Electrolytic treatment | None. |
| Solution treatment | None. |

EXAMPLE B

| | |
|---|---|
| Copper | Untreated electrosheet. |
| Electrolytic treatment | Bath of Example 1. |
| CD | 100 a./s.f. |
| Time | 25 sec. |
| Temp. | 70° F. |
| Anode | Copper. |
| Solution treatment | None. |

EXAMPLE C

| | |
|---|---|
| Copper | Untreated electrosheet. |
| Electrolytic treatment | Bath of Example 1. |
| CD | 100 a./s.f. |
| Time | 25 sec. |
| Temp. | 70° F. |
| Anode | Copper. |
| Solution treatment (after electrolytic treatment) | Bath—Alkaline 5% thiourea. |
| Time | 30 sec. |
| Temp. | 175° F. |

EXAMPLE D

| | |
|---|---|
| Copper | Untreated electrosheet. |
| Electrolytic treatment | Bath of Example 1. |
| CD | 100 a./s.f. |
| Time | 25 sec. |
| Temp. | 70° F. |
| Anode | Copper. |
| Solution treatment (after electrolytic treatment) | Bath—7% sodium dichromate. |
| Time | 30 sec. |
| Temp. | 65° F. |

Examples A, B, C and D were coated with Example 11 adhesive as previously described and bonded to produce XXXP laminate.

| | Ex. A | Ex. B | Ex. C | Ex. D |
|---|---|---|---|---|
| Solder resistance (Seconds to Blister at 500° F.) | 9 | 22 | 23 | 23 |
| Initial Peel Strength (lbs./in. width) | 7.5 | 9.5 | 9.6 | 10 |
| Peel Strength after 4 days at 140° C. (lbs./in. width) | 0.6 | 2.2 | 8.3 | 9.2 |

EXAMPLE 12.—PHENOL-ALDEHYDE—BUTADIENE ACRYLONITRILE COPOLYMER

| | Parts by weight |
|---|---|
| Phenol-aldehyde (Bakelite resin BKR 2620, Durez 11078, Durez 12687) | 70 |
| Butadiene acrylonitrile copolymer (Hycar 1001) | 100 |

The above constituents may be varied as follows to maximize certain specific adhesive properties and may be dissolved in a solvent blend consisting of 50 parts methyl ethyl ketone and 50 parts methyl isobutyl ketone by weight.

Phenoaldehyde—20 to 150 parts by weight (based on solids) per 100 parts butadiene acrylonitrile copolymer.

EXAMPLE 13. — PHENOL ALDEHYDE — BUTADIENE ACRYLONITRILE COPOLYMER—POLYEPOXIDE

| | Parts by weight |
|---|---|
| Phenol aldehyde (Bakelite resin BKR 2620) | 100 |
| Butadiene acrylonitrile copolymer (Hycar 1001) | 100 |
| Polyepoxide (Epon 828) | 50 |

The above constituents may be varied as follows to maximize certain specific adhesive properties and may be dissolved in a solvent blend consisting of 50 parts methyl ethyl ketone by weight and 50 parts by weight of methyl isobutyl ketones.

| | Parts by weight (based on solids) per 100 parts butadiene acrylonitrile copolymer |
|---|---|
| Phenol aldehyde | 20 to 150 |
| Polyepoxide | 10 to 150 |

Laminates of metal with insulating members are also made without any separate adhesive layer between the metal and the insulating member, e.g., where the insulating member is or contains an initially curable resin composition. Thus, for example, a common copper laminate used in the field of electrical printed circuits comprises a copper memer with one or more layers of glass cloth impregnated with an initially curable polyepoxide resin composition. The glass cloth layer is usually impregnated with a solution of a polyepoxide resin composition containing appropriate catalysts and then partially cured. The impregnated layers are then placed in a press with the copper and subjected to a sufficiently high temperature for an appropriate period of time in a suitable press to effect completion of the cure of the resin composition. As a result, the copper is bonded to the now-cured impregnated layers. With respect to such laminates, we have found that the bonding quality of the metal surface is substantially improved by the processes of this invention in the same manner as when used with a separate adhesive layer, with particularly marked improvement in peel strength after prolonged heat exposure where the surface treatment comprises the electrolytic treatment, followed by the solution treatment.

Although a number of specific examples of the various aspects of this invention have been described above, they are not intended to limit the scope of this invention. It should be noted, for example, that an ordinary person skilled in the art of adhesive formulations might select certain other ranges and proportions of the same or other ingredients for the adhesive compositions than those mentioned in the examples. With respect to the range of cathode current density of 10 to 150 amperes per square foot in the electrolytic treatment, our experiments indicate this to be the most useful and effective range. However, cathode current densities outside this range do improve bonding quality, although the process control required is more stringent.

We claim:

1. The method of treating a surface of copper sheet material to improve its bonding quality which comprises
   (a) employing a cyanide-free alkaline copper electrolytic bath consisting essentially of an aqueous solution of copper sulfate and a complexing agent selected from the group consisting of Rochelle salts and alkali metal salts of citric acid, lactic acid, glycollic acid, salicylic acid, glycerol, pyrophosphoric acid and tetraboric acid;
   (b) electrolyzing said bath using said surface as the cathode at a temperature of from about 50° F. to about 180° F., a cathodic current density of from about 10 to about 150 amperes per square foot and a treatment time of from about 2 to about 120 seconds, whereby there is formed on said surface a thin adherent micro-rough layer of substantially greater surface area than the original surface;
   (c) rinsing said surface after removal from said bath;
   (d) exposing the freshly prepared micro-rough surface from step (c) to a member of the group consisting of solutions of compounds which form a sulfide, telluride or selenide with copper and weakly acidic solutions of compounds which form a chromate, molybdate, tungstate or vanadate with copper.

2. The method of treating a surface of copper sheet material to improve its bonding quality which comprises
   (a) employing a cyanide-free alkaline copper electrolytic bath consisting essentially of an aqueous solution of copper sulfate and a Rochelle salt complexing agent;
   (b) electrolyzing said bath using said surface as the cathode at a temperature of from about 60° F. to about 110° F., a cathodic current density of from about 30 to about 100 amperes per square foot and a treatment time of from about 5 to about 40 seconds, whereby there is formed on said surface a thin, adherent micro-rough layer of substantially greater surface area than the original surface;
   (c) rinsing said surface after removal from said bath;
   (d) exposing the freshly prepared micro-rough surface from step (c) to a weakly acidic chromate-forming solution.

3. Copper sheet material having at least one surface of improved bonding quality, said surface having thereon a thin adherent micro-rough layer produced by the method of claim 1.

4. Adhesive coated sheet material comprising a copper sheet at least one surface of which contains a thin adherent micro-rough layer produced by the method of claim 1, said surface having thereon a superimposed layer of a thermosetting adhesive.

References Cited

UNITED STATES PATENTS

| | | | |
|---|---|---|---|
| 2,420,886 | 5/1947 | Laffoon | 204—38 |
| 2,493,092 | 1/1950 | Stareck | 204—52 |
| 2,522,474 | 9/1950 | Waitkins et al. | 148—6.24 |
| 2,593,922 | 4/1952 | Robinson et al. | 204—38 |
| 2,745,898 | 5/1956 | Hurd | 204—56 |
| 2,760,890 | 8/1956 | Kosmos | 148—6.2 |
| 2,783,194 | 2/1957 | Nobel et al. | 204—52 |
| 2,802,897 | 8/1957 | Hurd et al. | 174—110 |
| 2,887,442 | 5/1959 | Van Osterhout | 204—52 |
| 2,894,885 | 7/1959 | Gray | 204—1.5 |
| 2,932,599 | 4/1960 | Dahlgren | 156—3 |
| 3,053,692 | 9/1962 | Pocock | 148—6.2 |
| 3,114,683 | 12/1963 | Chorney | 204—56 |
| 3,198,672 | 8/1965 | Dehart | 204—38 |
| 3,220,897 | 11/1965 | Conley | 148—34 |
| 3,227,636 | 1/1966 | Dehart | 204—38 |

JOHN H. MACK, *Primary Examiner.*

JOHN R. SPECK, *Examiner.*

G. KAPLAN, W. VAN SISE, *Assistant Examiners.*